Oct. 19, 1965 M. NAIMAN 3,213,005

METHOD OF PREPARING SUPERCONDUCTIVE ELEMENTS

Filed Feb. 10, 1961

INVENTOR.
MARK NAIMAN

BY Robert Ames Norton

ATTORNEY

United States Patent Office 3,213,005

Patented Oct. 19, 1965

3,213,005

METHOD OF PREPARING SUPERCONDUCTIVE ELEMENTS

Mark Naiman, Philadelphia, Pa., assignor to Sperry Rand Corporation, New York, N.Y., a corporation of Delaware Filed Feb. 10, 1961, Ser. No. 88,536
5 Claims. (Cl. 204—40)

Figure 1:
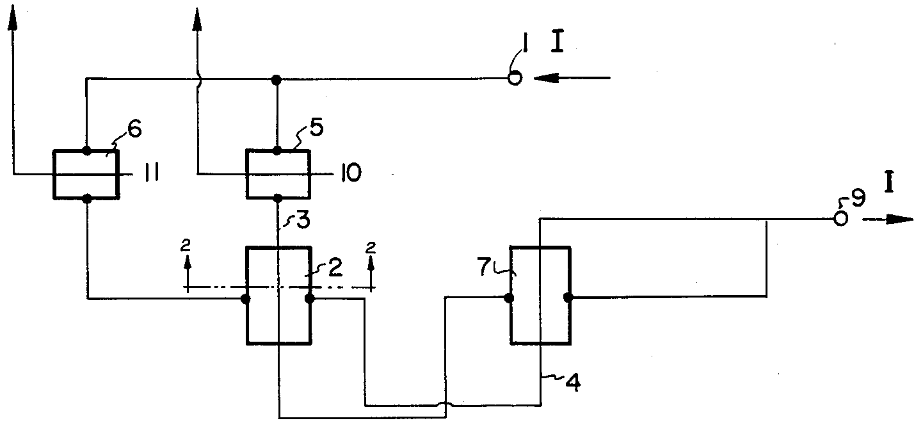

This invention relates to an improved process of preparing thin film superconductor memory elements and includes the new elements themselves.

A number of thin film memory elements have been made in the past with various metals and metal alloys, the crystal structure of which is such that they become superconductors at very low temperatures, close to 0° Kelvin. Among other properties, a superconductor will lose its superconductivity at a critical temperature under the influence of a magnetic field. The magnetic field acts very much as if it were an increased temperature. In other words, if a given metal becomes a superconductor at one critical temperature and is subjected to a magnetic field it will lose its superconductivity and will not again become a superconductor except at a somewhat lower temperature. The effect of a magnetic field will differentiate between different materials. For example, if components of lead and tin are present in a memory element and the temperature is lowered the lead first becomes a superconductor while tin does not. At a still lower temperature tin also becomes a superconductor but when a magnetic field is applied the tin may lose its superconductivity while the lead retains its. As a result the tin may be used as a gate, changing from superconductor to an ordinary conductor and back when a magnetic field is applied or removed. Tin is the most common gating superconductor but other metals may also be used at the temperatures at which they change their conductivity under the influence of a magnetic field.

In the past the components of a computing or memory element have been prepared by evaporating various metallic layers separated by suitable insulators of dielectric material. This may be illustrated by the description of a typical element, though of course the invention is not limited thereto. Such an element may include a substrate, such as glass, and a thin ground plane of a metal such as lead. The next layer would then be a dielectric followed by an evaporated layer of tin to act as a gate, another layer of dielectric and various leads which may also be of lead. These leads may or may not also be separated by layers of dielectrics. When the element is maintained at the temperature at which superconduction of the tin either just does or just does not occur, depending on the presence of a magnetic field, the tin layer acts as a gate and its resistance disappears or reappears. It is normally desirable to keep inductances low which permits faster switching, and the presence of the ground plane aids in achieving this result since magnetic fields do not significantly penetrate a superconductor. In general, following good practice, the control leads should be considerably narrower than the tin gate. The typical widths are 0.006″ for the control leads and 0.125″ for the gate.

The overall organization of the elements and their particular design and functioning does not form any part of the present invention which is directed to an improved process of making elements involving superconductors, and in another aspect also includes improved elements thus made.

When evaporation deposition is used, as in the past, it is common to evaporate layers of silicon monoxide as dielectric films. These procedures, however, tend to contaminate the films, and particularly the superconducting films. For example, the tin film may be partly oxidized which interferes with, or may completely nullify, its operation as a superconductor. Serious problems also arise when an array of elements is to be prepared. This ordinarily requires masking to produce a large number of extremely fine conducting paths in designated areas. Unfortunately the edges of the masked openings tend to cast deposition shadows, resulting in depositions which are thinner as they approach the edges of the masked openings. This is undesirable both from the standpoint of uniformity and by reason of the fact that the thinner layers require higher magnetic fields for switching. As a result arrays of superconductor elements have been difficult to produce with the desired uniformity and reliability, and cost has been increased.

The present invention eliminates the problems hitherto presented by a new method which produces a new kind of computing or memory element though it may functionally resemble similar elements produced by the known methods. Essentially the present invention substitutes for the dielectric layers used as insulators, layers of conductors which, although they have significant conductivity, act as insulators in comparison to the conductivity of the superconductor components of the element. This really constitutes a new conception of insulation at low temperatures. Even a layer of higher resistance material which might have a resistivity of a few ohm-cm. or so behaves as if it were an insulator as compared with a superconductor. However, it is still a conductor and is not a dielectric, which opens up several advantageous possibilities. First, it permits a much better process of forming the superconductor layers, and second, the fact that the insulating layers do in effect have some ohmic conductance makes it possible to add desirable characteristics to the finished element.

From the process standpoint the substitution of moderately high resistance conductors for dielectrics makes it possible to use plating processes. When various metallic layers are plated rather than vacuum deposited it is possible to avoid contamination of the superconductor components, and to maintain a very precise and uniform film thickness even when the plating is effected through very complicated masks having minute openings. Great uniformity and great reliability results. This is particularly important where large arrays of elements are to be prepared which sometimes contain many thousands of elements. The unreliability and non-uniformity of the deposited layers in the past has greatly increased rejections and adversely affected overall quality. The higher resistance conductors which act as insulating layers in the present invention have a conductivity which is more than adequate for plating purposes, and it is an advantage of the present invention that more or less normal plating conditions for the particular metal layers can be followed.

The so-called insulating layers of the present invention may use metals or metal alloys which are true ohmic conductors, but which because of their crystal structure or other characteristics do not become superconductors at low temperatures. Without limiting the invention to particular insulating layers a few typical materials may be enumerated, among which one of the best is the resistance alloy constantan, which is a copper-nickel alloy and may contain minute amounts of manganese and iron. Other alloys are nickel-chromium alloys, such as nichrome, chromel, and the like. In general, any ohmic conductor having sufficient conductivity at ordinary electroplating temperatures to permit electroplating, and which does not become a superconductor at very low temperatures, may be used.

The present invention is not limited to any particular combinations of superconductors. Tin and lead have been mentioned with tin as the gate, and this is a very satisfactory combination. Other typical metals which are capable of becoming superconductive at low temperatures include vanadium, niobium, tantalum and the like.

An element has been referred to above which contained two superconductors, lead and tin. In a great many elements it is sufficient to have two, one of which acts as a gate. However, it should be understood that the present invention, both from its process and product aspects, is also applicable to elements which have more than two different superconductors. For example, one superconductor may remain superconducting even under a fairly high magnetic field; a second one will lose its superconductivity under a fairly high magnetic field but will not at a low field, and the third may lose its superconductivity at the low field. All of these different layers are readily and accurately formed by ordinary electroplating.

Considering the new superconductor elements as articles of manufacture, they possess all of the desirable properties of the elements formerly produced without having the undesirable ones. Moreover, the use of the ohmic insulators, instead of dielectrics, endows the resulting elements with an additional valuable property. Thus, since, the so-called insulators are actually conductors of moderate resistance, all circuits can be switched to ground when not superconducting. This is advantageous for many purposes, and is a new property which was not possessed, even in imperfect form, by the elements that were made by the old evaporative processes with dielectric insulators.

Figure 2:
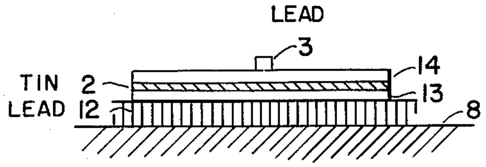

The invention will be described in more detail in conjunction with the drawings in which:

FIG. 1 is simplified schematic of two elements connected to form a bistable circuit, and FIG. 2 is a cross-section along the line 2—2 of FIG. 1.

FIG. 1 shows a typical superconductor circuit with two elements arranged in a bistable circuit. These elements are connected between two sources 1 and 9 of constant current. From source 1 the circuit divides and passes across two supercooled tin gates 5 and 6. From here lead leads carrying one branch to a memory element 2, in which a narrow lead lead 3 is separated by an ohmic insulator from a tin gate 2. The other branch connects to an edge of the gate. The lead 3 continues on to one edge of a tin gate 7, the other edge being connected to the other end of the constant current source 9. From the other edge of the tin gate 2 a lead lead 4 passes across the tin gate 7, separated therefrom by an ohmic insulator. Two other leads 10 and 11 are across the gates 5 and 6.

As shown the circuit is in one of its stable states in which the gates 2 and 6 are superconductive, but the strong current flowing through lead lead 4 creates a sufficient magnetic field in the tin gate 7 so that the latter is no longer a superconductor. All the gates are, of course, kept at the temperature at which tin is a superconductor in the absence of a magnetic field. If now there is applied a strong magnetic field by current flowing through the lead 11 the gate 6 is no longer superconductive, the current through lead 4 drops, removing the magnetic field from the tin gate 7 which now becomes superconductive, and the resulting heavy current through the lead lead 3 places sufficient magnetic field on the tin gate 2, so that the latter becomes no longer superconductive. As a result the circuit has been flipped from the first stable stage to the second one. If then a pulse of suitable magnitude is applied to the lead 10, gate 5 momentarily loses superconduction, and gate 6, which in the meantime has reverted to its superconducting state, causes a heavy flow of current through gate 2 which becomes superconducting and a heavy current flows through lead lead 4, which closes gate 7, flopping the circuit back to its original state.

It will be seen that the simple elements require a lead lead across a tin gate. They also require a ground plane so that when one gate or the other closes its shielding effect is removed and a signal can be taken off from the ground plane. Construction of such a memory element is shown in FIG. 2, with the layer thickness enormously exaggerated for clarity. The whole memory element is mounted on a suitable substrate 8 which may be of glass, and on which a lead ground plane 12 has been deposited. Thereupon a layer of constantan 13 is plated or otherwise affixed to the ground plane 12, followed by plating a tin gate layer 2, another constantan layer 14, and finally, through a mask, the narrow thin lead lead 3. Each layer is uniform and unbroken, and there is no edge effect, particularly in plating the very narrow lead lead 3.

In the drawings the dimensions of the tin gates and lead leads have been enormously exaggerated. Thus, for example in a typical memory element the tin gates 2 and 7 would be small rectangles 0.1" long, 0.01" wide, and a few microns thick. The relative dimensions of lead lead 3 and tin gate 2 shown in FIG. 2 are substantially typical.

It will be noted that when the tin layer 2 is not superconducting, that is there is sufficient current through the control lead 3 so that the magnetic field has destroyed superconductivity in the tin, there is still a very low ohmic resistance between the tin gate 2 and the ground plane. This resistance is determined by the thickness of the constantan layer 13 which is quite thin and constitutes a resistance much lower than that across the tin gate 2. Therefore in its non-superconducting state this gate is effectively grounded. This makes it possible to design circuits where it is desired to ground gates when they are not in the superconducting state, and adds to the flexibility and usefulness of the resulting memory elements. As a result the present invention not only produces a memory element which is more uniform, more reliable and cheaper, but it also produces an element which has a different or rather an additional characteristic, namely grounding, when the gates are in a state of normal resistance.

I claim:

1. The method of producing an element of the superconductive type which contains at least two layers of superconductive metal separated by a layer of a metal ohmic conductor which does not become superconductive at low temperatures which comprises electroplating a first superconductive metal layer onto a suitable substrate, electroplating on said layer of said first conductive metal a thin film of a metal ohmic conductor and electroplating on said thin film of said metal ohmic conductor a second layer of a second superconductive metal, said second superconductive metal having a different superconductive critical temperature than said first superconductive metal and said metal ohmic conductor having low conductivity at superconductive temperatures close to 0° K. and serving as an insulating layer at said temperatures and having sufficient conductivity at ordinary electroplating temperatures to permit electroplating, and utilizing said element at superconductive temperatures.

2. A method in accordance with claim 1 wherein said first superconductive metal and said second superconductive metal are selected from the group consisting of tin, lead, vanadium, niobium and tantalum.

3. A method in accordance with claim 1 wherein said metal ohmic conductor is constantan.

4. A method in accordance with claim 1 wherein said first superconductive metal and said second superconductive metal are selected from the group consisting of tin, lead, vanadium, niobium and tantalum and wherein said metal ohmic conductor is an alloy selected from the group consisting of copper-nickel alloys and nickel-chromium alloys.

5. A method in accordance with claim 1 wherein said first superconductive metal is lead, said second superconductive metal is tin and said metal ohmic conductor is constantan.

References Cited by the Examiner

UNITED STATES PATENTS

| | | | |
|---|---|---|---|
| 787,047 | 4/05 | Leonard | 338—208 |
| 2,490,700 | 12/49 | Nachtman | 204—40 |
| 2,884,345 | 4/59 | Rocard et al. | 117—201 |
| 2,888,370 | 5/59 | Damon et al. | 117—201 |
| 2,894,885 | 7/59 | Gray | 204—40 |
| 2,912,312 | 11/59 | Japel | 204—15 |
| 2,934,736 | 4/60 | Davis | 338—308 |
| 2,935,717 | 5/60 | Solow | 338—308 |
| 2,966,647 | 12/60 | Lentz | 338—32 |
| 2,989,716 | 6/61 | Brennemann et al. | 338—32 |
| 3,058,851 | 10/62 | Kahan | 117—217 |
| 3,115,612 | 12/63 | Meissner | 338—32 |

JOHN H. MACK, *Primary Examiner.*

RAY K. WINDHAM, JOHN R. SPECK, MURRAY TILLMAN, WINSTON A. DOUGLAS, *Examiners.*